(12) United States Patent
Karasawa et al.

(10) Patent No.: US 9,331,684 B2
(45) Date of Patent: May 3, 2016

(54) SEMICONDUCTOR DEVICE FOR SENSING PHYSICAL QUANTITY

(71) Applicant: FUJI ELECTRIC CO., LTD., Kawasaki-shi (JP)

(72) Inventors: Katsuya Karasawa, Shiojiri (JP); Mutsuo Nishikawa, Matsumoto (JP); Kazuhiro Matsunami, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/642,413

(22) Filed: Mar. 9, 2015

(65) Prior Publication Data
US 2015/0288354 A1  Oct. 8, 2015

(30) Foreign Application Priority Data

Apr. 4, 2014  (JP) ................................. 2014-077601

(51) Int. Cl.
*H03K 5/153* (2006.01)
*H03K 5/24* (2006.01)
*G01K 13/00* (2006.01)
*G01L 27/00* (2006.01)

(52) U.S. Cl.
CPC ........ *H03K 5/24* (2013.01); *G01K 13/00* (2013.01); *G01L 27/00* (2013.01)

(58) Field of Classification Search
CPC ............. H03K 3/2893; H03K 3/3565; H03K 3/02337; H03K 3/0377; H03K 3/011

USPC ............................................. 327/77, 205, 206
See application file for complete search history.

(56) References Cited

U.S. PATENT DOCUMENTS

| 4,527,076 A | * | 7/1985 | Matsuo et al. ................... 327/88 |
| 7,928,787 B2 | * | 4/2011 | Mehas et al. ................... 327/205 |
| 2002/0149984 A1 | | 10/2002 | Nishikawa et al. |
| 2006/0238186 A1 | | 10/2006 | Nishikawa et al. |

FOREIGN PATENT DOCUMENTS

| JP | 2002-310735 A | 10/2002 |
| JP | 2006-324652 A | 11/2006 |

* cited by examiner

*Primary Examiner* — Quan Tra
(74) *Attorney, Agent, or Firm* — Rabin & Berdo, P.C.

(57) ABSTRACT

A semiconductor device 3 for sensing a physical quantity adjusts the output characteristic of a pressure sensor, for example, based on trimming data stored in an EPROM 34. A comparator 311 compares an input voltage given to a terminal 43 and a predetermined reference voltage, and delivers a write control signal for EPROM 34. When the comparator 311 delivers a Low signal for the EPROM 34, a first gate circuit 312 provided between the terminal 43 and a temperature sensor 32 connects the terminal 43 and the temperature sensor 32. A second gate circuit 313 provided between the terminal 43 and a pull-down resistor 314 disconnects the terminal 43 and the pull-down resistor 314. The operational voltage of the temperature sensor 32 is lower than the reference voltage, and the terminal 43 is used as an output terminal for the temperature sensor 32.

12 Claims, 6 Drawing Sheets

SEMICONDUCTOR DEVICE FOR SENSING PHYSICAL QUANTITY

CROSS-REFERENCE TO RELATED APPLICATION

This application is based on, and claims priority of, Japanese Patent Application No. 2014-077601, filed on Apr. 4, 2014, contents of which are incorporated herein by reference.

BACKGROUND OF THE INVENTION

1. Field of the Invention

The present invention relates to a semiconductor device for sensing a physical quantity 2. Description of the Related Art A conventional semiconductor device for sensing a physical quantity, for example, a pressure sensor or an acceleration sensor, often performs adjustment of characteristics by means of trimming in order to improve measurement accuracy. Patent Documents 1 and 2 (identified below), for example, disclose a trimming method for the characteristic adjustment of a semiconductor device for sensing a physical quantity in which electric trimming is conducted based on correction data, or trimming data, written in a nonvolatile memory such as an erasable programmable read only memory (EPROM) or an electrically erasable programmable read only memory (EEPROM).

Recently, semiconductor devices for sensing a physical quantity are required for higher performance; one product has a multiple of functions. Responding to the demand for higher performance, Patent Document 2 discloses a pressure sensor containing a temperature sensor. The technology in the Patent Document 2 carries out temperature detection based on a voltage value measured by a voltage measuring means when a predetermined current is supplied by a current generating means to the temperature detecting section.

[Patent Document 1]
Japanese Unexamined Patent Application Publication No. 2002-310735
[Patent Document 2]
Japanese Unexamined Patent Application Publication No. 2006-324652

In the case in which an additional function, or additional cell, such as a temperature sensor, is provided in an integrated circuit (IC) chip, however, a new output terminal generally needs to be provided for extracting an electric signal from the added cell and the output terminal needs to be connected to an electrode pad on the IC chip with a bonding wire. When a new output terminal is difficult to add, redesign is required, which leads to increased cost.

SUMMARY OF THE INVENTION

It is therefore an object of the present invention to solve the problems in conventional technology and provide a semiconductor device for sensing a physical quantity that permits adding a new function without providing a new terminal.

To solve the problem and achieve the object, the inventors of the present invention have made extensive studies and found that an additional new function can be included without providing a new terminal by using an existing terminal for use in writing a trimming data into a nonvolatile memory as an output terminal for the new additional function. The present invention has been accomplished based on this finding.

More specifically, a semiconductor device for sensing physical quantity of the present invention is a semiconductor device for sensing physical quantity having a first sensor element generating an electric signal corresponding to a detected physical quantity and a nonvolatile main memory circuit storing a trimming data for adjusting an output characteristic of the first sensor element by electric writing operation, and adjusting the output characteristic of the first sensor element based on the trimming data. The semiconductor device for sensing physical quantity comprises an input terminal that receives an input signal at a specified voltage. The semiconductor device for sensing physical quantity comprises a second sensor element that generates an electric signal corresponding to a detected temperature. The semiconductor device for sensing physical quantity comprises a comparator circuit that compares the specified voltage applied to the input terminal and a predetermined reference voltage, and delivers a control signal for controlling writing operation into the main memory circuit based on the comparison result. The semiconductor device for sensing physical quantity comprises a first changeover circuit that changes-over ON and OFF of a first switch for connecting the input terminal and the second sensor element according to the control signal. The input terminal is used for an output terminal to deliver externally an electric signal generated by the second sensor element when the first changeover circuit changes the first switch to an ON state and connects the input terminal and the second sensor element.

The semiconductor device for sensing physical quantity of the invention is the semiconductor device for sensing physical quantity as stated above wherein the comparator circuit, when the specified voltage is lower than the reference voltage, delivers the control signal that is a first specific signal to prohibit writing operation into the main memory circuit, and the first changeover circuit changes-over the first switch into an ON state according to the first specific signal.

The semiconductor device for sensing physical quantity of the invention is the semiconductor device for sensing physical quantity as stated above further comprising a resistor that is connected to a second switch at one end of the resistor and the other end is grounded; and a second changeover circuit that changes-over ON and OFF of the second switch to connect the input terminal and the resistor according to the control signal. The second changeover circuit changes-over the second switch into an OFF state according to the first specific signal to disconnect the input terminal and the resistor thereby pulling down a voltage applied on the second changeover circuit to a ground level.

The semiconductor device for sensing physical quantity of the invention is the semiconductor device for sensing physical quantity as state above wherein the comparator circuit, when the specified voltage is not lower than the reference voltage, delivers the control signal that is a second specific signal to permit writing operation into the main memory circuit. The first changeover circuit changes the first switch into an OFF state according to the second specific signal to disconnect the input terminal and the second sensor element. The trimming data is written into the main memory circuit according to the second specific signal.

The semiconductor device for sensing physical quantity of the invention is the semiconductor device for sensing physical quantity as stated above further comprising a resistor that is connected to a second switch at one end of the resistor and the other end is grounded; and a second changeover circuit that changes-over ON and OFF of the second switch to connect the input terminal and the resistor according to the control signal. The second changeover circuit changes-over the second switch into an ON state according to the second specific signal to connect the input terminal and the resistor.

The semiconductor device for sensing physical quantity of the invention is the semiconductor device for sensing physical quantity as stated above wherein an operation voltage of the second sensor element is lower than the reference voltage.

In the semiconductor device for sensing physical quantity of the invention, when the output signal of the second sensor element is delivered externally, the first switch is changed-over into an ON state so that the newly added second sensor element is connected to an existing input terminal that receives an enable signal for controlling write operation to the main memory. Thus, the input terminal is used for an output terminal of the second sensor element. Therefore a new additional function can be provided without newly adding an additional terminal.

DETAILED DESCRIPTION OF THE INVENTION

A preferred embodiment of the present invention will be described in detail in the following with reference to the accompanying drawings. In the description about the embodiment of the invention and in the accompanying drawings, the same structure is given the same symbol and repeated description thereon is omitted.

Embodiment Example

Figure 1:
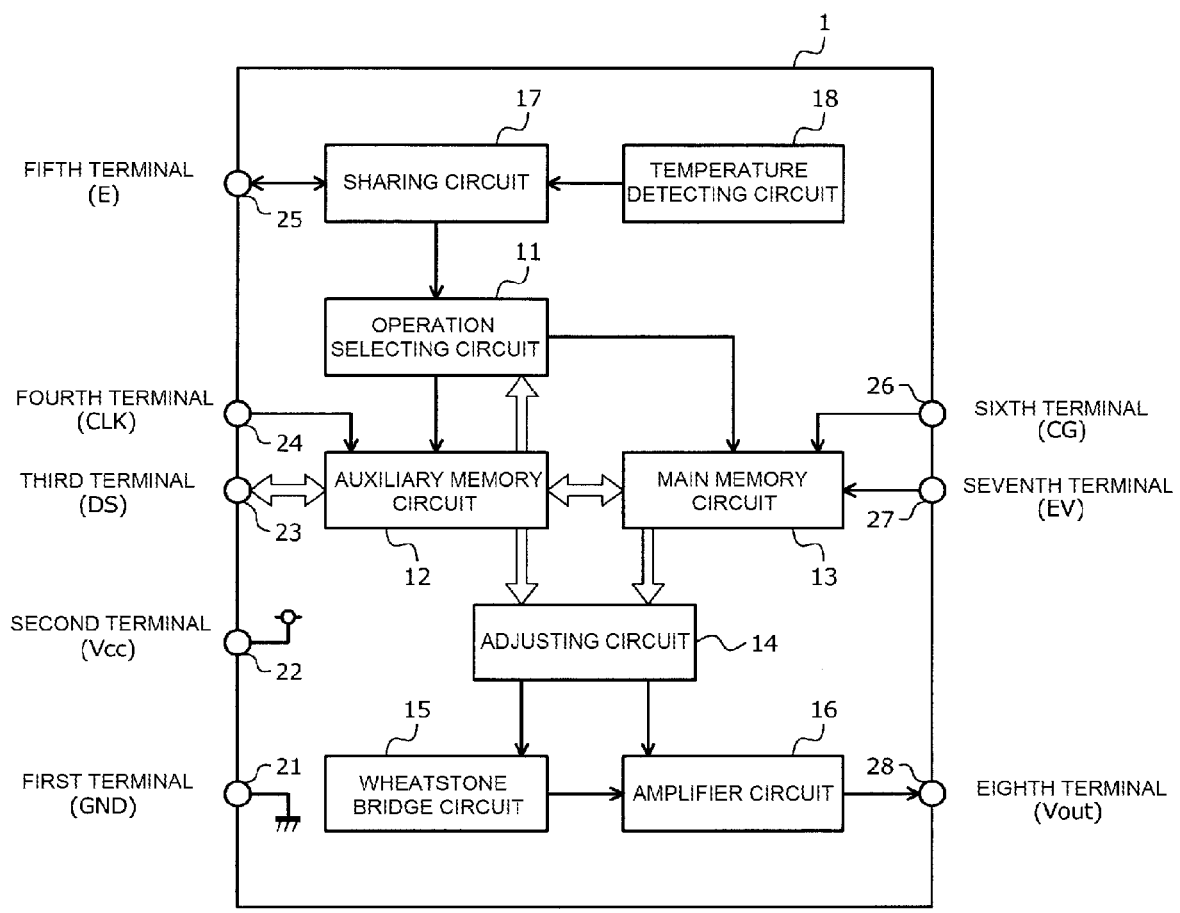
FIG. 1 is a block diagram showing an example of an overall construction of a semiconductor device for sensing physical quantity according to an embodiment of the present invention.

Now, description will be made about the construction of a semiconductor device for sensing physical quantity according to an embodiment of the invention. FIG. 1 is a block diagram showing an example of the overall construction of a semiconductor device for sensing a physical quantity according to an embodiment of the present invention. The semiconductor device for sensing a physical quantity 1 comprises: for example, an operation selecting circuit 11, an auxiliary memory circuit 12, a main memory circuit 13, an adjusting circuit 14, a Wheatstone bridge circuit 15 that is composed of a first sensor element, an amplifier circuit 16, a common or sharing circuit 17, a temperature detecting circuit 18 that is composed of a second sensor element, and eight terminals, first to eighth terminals 21 to 28.

The first terminal 21 supplies a ground potential to the semiconductor device for sensing physical quantity 1. The second terminal 22 supplies an operation voltage for the semiconductor device for sensing physical quantity 1. The third terminal 23 performs input and output of serial digital data. The third terminal 23 carries out giving and taking of serial data between the semiconductor device for sensing physical quantity 1 and an external circuit. The fourth terminal 24 receives an external clock. The fourth terminal 24 supplies an external clock to the semiconductor device for sensing physical quantity 1.

The fifth terminal 25, which is an input terminal, receives a control signal for an internal digital circuit. The fifth terminal 25 is simultaneously delivers externally a detected signal of the temperature detecting circuit 18. The sixth terminal 26 supplies a voltage not lower than the operation voltage applied to the second terminal 22 when a data is written to the main memory circuit 13. The seventh terminal 27, supplies a voltage not lower than the operation voltage applied to the second terminal 22 and different from the voltage that is supplied to the sixth terminal 26, when a data is written to the main memory circuit 13. The eighth terminal 28 delivers externally a detected signal of the semiconductor device for sensing physical quantity 1.

The auxiliary memory circuit 12 converts the serial digital data supplied from the outside to a parallel digital data for use internally at an operation timing based on the external clock given to the fourth terminal 24. The auxiliary memory circuit 12 also converts the parallel digital data used internally to a serial digital data for delivering externally. The auxiliary memory circuit 12 further supplies a control data to the operation selecting circuit 11. More specifically, the auxiliary memory circuit 12 is a shift register, for example. The main memory circuit 13 stores a trimming data composed of the parallel digital data supplied from the auxiliary memory circuit 12 corresponding to the voltage applied to the sixth terminal 26 and the seventh terminal 27. More specifically, the main memory circuit 13 is a nonvolatile memory such as programmable read only memory (PROM), EPROM, or EEPROM.

The operation selecting circuit 11 supplies a signal for controlling data input and output to the auxiliary memory circuit 12 and main memory circuit 13 according to the control signal given to the fifth terminal 25 and the control data supplied from the auxiliary memory circuit 12. The Wheatstone bridge circuit 15 generates an output signal corresponding to a physical quantity of a medium to be measured. More specifically, the Wheatstone bridge circuit 15 can be a gauge circuit composed of a semiconductor strain gauge that generates an output signal corresponding to an applied pressure. The amplifier circuit 16 amplifies the output signal from the Wheatstone bridge circuit 15 and delivers the signal externally through the eighth terminal 28.

The adjusting circuit 14, based on the trimming data supplied from the auxiliary memory circuit 12 or main memory circuit 13, conducts sensitivity adjustment corresponding to the temperature characteristic to the Wheatstone bridge circuit 15, and also conducts offset adjustment corresponding to the temperature characteristic to the amplifier circuit 16. The sharing circuit 17 has a function to share an output terminal for delivering externally an output signal of the temperature detecting circuit 18 with the fifth terminal 25 for receiving a control signal toward an internal digital circuit. The temperature detecting circuit 18 generates an output signal corresponding to the temperature in the semiconductor device for sensing physical quantity 1. More specifically, the temperature detecting circuit 18 can be a temperature sensor utilizing the characteristic in which a base-emitter voltage of a transistor varies virtually linearly with temperature variation A single semiconductor chip can mount all of the components: the operation selecting circuit 11, the auxiliary memory circuit 12, the main memory circuit 13, the adjusting circuit 14, the Wheatstone bridge circuit 15, the amplifier circuit 16, the sharing circuit 17, and the temperature detecting circuit 18. Those components are composed exclusively of active elements and passive elements that are manufactured by a complimentary metal-oxide-semiconductor (CMOS) production process. A digital circuit section comprises the operation selecting circuit 11, the auxiliary memory circuit 12, the main memory circuit 13, and the sharing circuit 17. An analogue circuit section comprises the adjusting circuit 14, the Wheatstone bridge circuit 15, the amplifier circuit 16, and the temperature detecting circuit 18.

Figure 2:
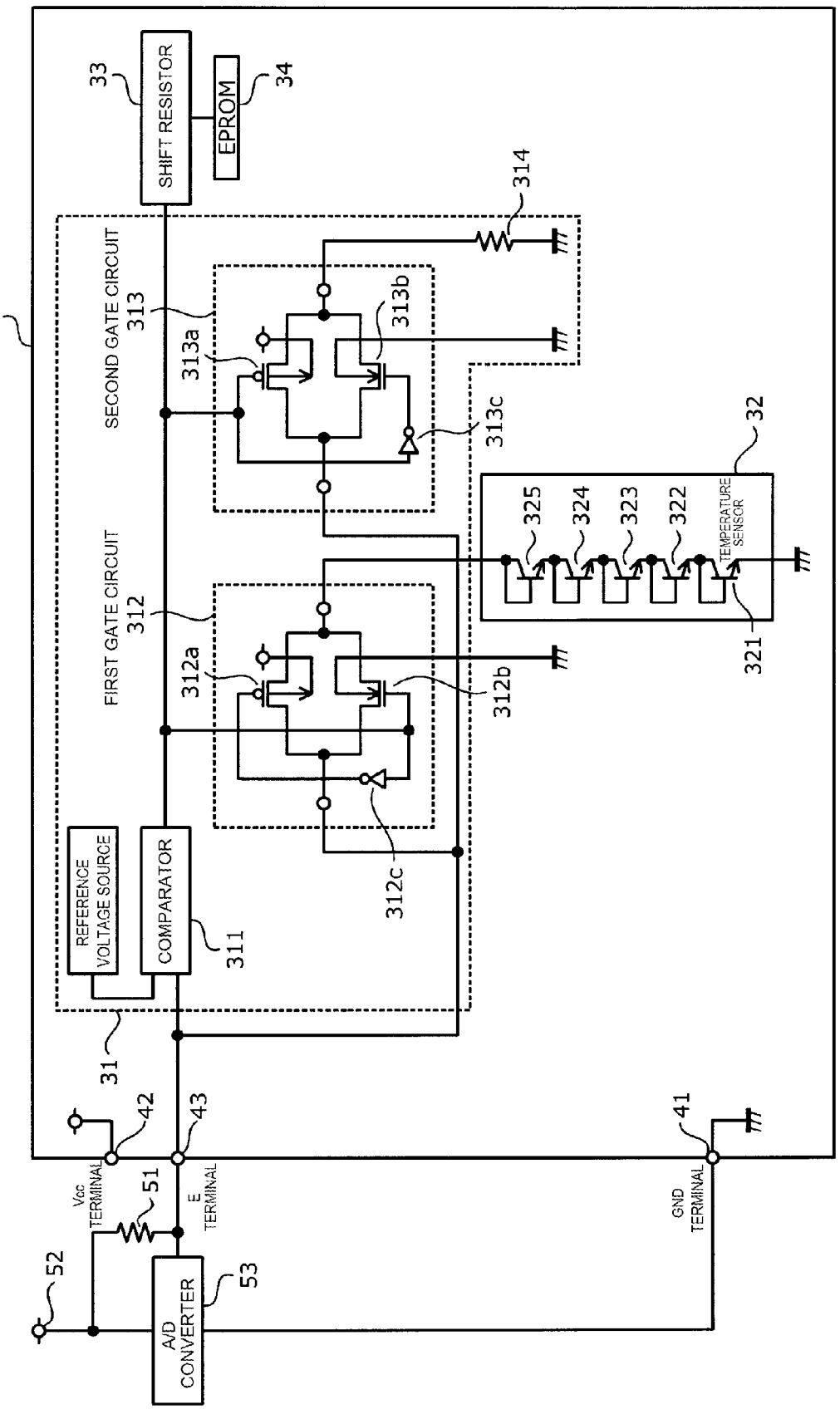
FIG. 2 is a block diagram showing an example of essential part construction of a semiconductor device for sensing physical quantity formed on a semiconductor chip in application of the present invention.

Now, a construction of an essential part of a semiconductor device for sensing physical quantity formed on a semiconductor chip according to the present invention. FIG. 2 is a block diagram showing an example of essential part construction of a semiconductor device for sensing physical quantity formed on a semiconductor chip in application of the present invention. FIG. 2 illustrates an example of construction for input connection changeover by the sharing circuit 17 indicated in FIG. 1. A semiconductor device for sensing a physical quantity 3 comprises: a sharing circuit of a terminal pad 31, a temperature sensor 32, which is a second sensor element, a shift resistor 33, and an EPROM 34. The semiconductor device for sensing physical quantity 3 is provided with a GND terminal 41, a Vcc terminal 42, and an E terminal 43, which are terminals for power supply from outside, and signal transmission, wherein the E terminal 43 is an input terminal.

The GND terminal 41 supplies a ground potential and the Vcc terminal 42 supplies a power supply potential at 5 V, for example, to the semiconductor device for sensing physical quantity 3. The E terminal 43 receives from outside an enable signal for controlling the operation condition of the digital circuits in the semiconductor device for sensing physical quantity 3. More specifically, the E terminal 43 receives an input signal, which is a write control signal, at a specified voltage Vin, which is an input voltage, for triggering writing of trimming data into the EPROM 34. The write control signal is either one of the two signals: a High signal, which is a second specific signal, or a Low signal, which is a first specific signal. The High signal is a write control signal to permit writing operation into the EPROM 34. The Low signal is a write control signal to prohibit writing operation into the EPROM 34. The E terminal 43 works as a terminal to deliver an output signal from the temperature sensor 32 to the outside of the semiconductor device for sensing physical quantity 3. The output signal of the temperature sensor 32 is measured by an A/D converter 53 disposed outside the semiconductor device for sensing physical quantity 3.

The sharing circuit of a terminal pad 31 comprises a comparator 311, a first gate circuit 312, which is a first changeover circuit, a second gate circuit 313, which is a second changeover circuit, and a pull-down resistor 314. The sharing circuit of a terminal pad 31 is connected between the E terminal 43 and the shift resistor 33, and between the E terminal 43 and the temperature sensor 32. The comparator 311 is connected between the E terminal 43 and the shift resistor 33. The comparator 311 receives an input voltage Vin applied upon delivery of an input signal to the E terminal 43 and a predetermined reference voltage Vref. The reference voltage Vref is generated, for example, by a reference voltage source, which is a voltage source having a commonly used construction to maintain a constant voltage. The reference voltage Vref has a voltage value between the High signal and the Low signal for the EPROM 34, and a reference value to determine the write control signal for the EPROM 34. More specifically, the reference voltage Vref is lower than the voltage V1, which is 5 V, for example, applied to the Vcc terminal 42, and higher than the voltage V0, which is 0 V, for example, applied to the GND terminal 41: $V0 < Vref < V1$.

The comparator 311 compares the magnitudes of the input voltage Vin applied to the E terminal 43 and the predetermined reference voltage Vref, and delivers a write control signal, the High signal or the Low signal, for the EPROM 34 according to the comparison result. More specifically, if the input voltage Vin applied to the E terminal 43 is not lower than the reference voltage Vref: $Vin \geq Vref$, the comparator 311 delivers the High signal for the EPROM 34. If the input voltage Vin applied to the E terminal 43 is lower than the reference voltage Vref: $Vin < Vref$, the comparator 311 delivers the Low signal for the EPROM 34. The comparator 311 delivers, in an operation mode to write into the EPROM 34, the same signal as the input signal given to the E terminal 43. The output signal of the comparator 311, which is a write control signal for the EPROM 34, is also a gate control signal for changeover ON and OFF of the switches composing the first gate circuit 312 and the second gate circuit 313.

The first gate circuit 312 is connected between the E terminal 43 and the temperature sensor 32, and conducts changeover connection between the E terminal 43 and the temperature sensor 32 according to the output signal of the comparator 311. More specifically, the first gate circuit 312 is composed of a commonly employed transmission gate, which is a first switch, having a p type MOSFET 312a, an n type MOSFET 312b, and an inverter 312c. The p type MOSFET 312a and the n type MOSFE 312b are connected complimentarily and conduct gate driving operation according to the output signal of the comparator 311. The input terminal of the inverter 312c is connected to the comparator 311, and the output terminal of the inverter 312c is connected to the gate of the p type MOSFET 313a.

The first gate circuit 312 provided in the semiconductor device for sensing physical quantity 3 makes an OFF state between the drain and source of the p type MOSFET 312a and the n type MOSFET 312b when the output signal of the comparator 311 is the High signal for the EPROM 34. Thus, the E terminal 43 and the temperature sensor 32 are disconnected, which is an OFF operation of the first gate circuit 312. When the output signal of the comparator 311 is the Low signal for the EPROM 34, the first gate circuit 312 makes an ON state between the drain and source of the p type MOSFET 312a and the n type MOSFET 312b. Thus, the E terminal 43 and the temperature sensor 32 are connected, which is an ON operation of the first gate circuit 312.

The second gate circuit 313 is connected between the E terminal 43 and the pull-down resistor 314, and changes-over connection between the E terminal 43 and the pull-down resistor 314 according to the output signal of the comparator 311. More specifically, the second gate circuit 313 is composed of a generally employed transmission gate, which is a second switch, having a p type MOSFET 313a, an n type MOSFET 313b, and an inverter 313c. The p type MOSFET 313a and the n type MOSFET 313b are connected complimentarily and conduct gate drive operation according to the output signal of the comparator 311. The input terminal of the inverter 313c is connected to the comparator 311, and the output terminal of the inverter 313c is connected to the gate of the n type MOSFET 313b.

The second gate circuit 313 provided in the semiconductor device for sensing physical quantity 3 makes, when the output signal of the comparator 311 is the High signal for the EPROM 34, an ON state between the drain and source of the p type MOSFET 313a and the n type MOSFET 313b. Thus, the E terminal 43 and the pull-down resistor 314 are connected, which is an ON operation of the second gate circuit 313. When the output signal of the comparator 311 is the Low signal for the EPROM 34, the second gate circuit 313 makes an OFF state between the drain and source of the p type MOSFET 313a and the n type MOSFET 313b. Thus, the E terminal 43 and the pull-down resistor 314 are disconnected, which is an OFF operation of the second gate circuit 313.

The temperature sensor 32 detects the temperature in the semiconductor device for sensing physical quantity 3. The operation voltage of the temperature sensor 32 is lower than the reference voltage Vref. More specifically, the temperature sensor 32 is composed of one npn transistor or a plurality of npn transistors connected in series multiple stages. The operation voltage of the temperature sensor 32, or the reference voltage Vref of the comparator 311, is determined corresponding to the number of stages of the npn transistors composing the temperature sensor 32. FIG. 2 shows the temperature sensor 32 having five npn transistors 321 to 325 connected in multiple stages. More specifically, in the temperature sensor 32, the collector of the npn transistor 321 is connected to the emitter of the npn transistor 322, and the collector of the npn transistor 322 is connected to the emitter of the npn transistor 323. The npn transistors 323 through 325 are sequentially connected in the similar manner as indicated in FIG. 2.

Each of the npn transistors 321 through 325 has the base and the collector short-circuited. The pn junction between the base and the collector that are short-circuited and maintained at the same potential cannot work any function, and solely the pn junction between the base and the emitter functions electrically. Consequently, each of the npn transistors 321 through 325 works as a diode. The node between the base and the collector of each of the npn transistors 321 through 325 becomes an anode of a diode and the collector becomes a cathode. The emitter of the npn transistor 321, which is the cathode of the diode, is grounded. The node between the base and the collector of the npn transistor 325, which is the anode of the diode, is connected to the drains of the p type MOSFET 312a composing the first gate circuit 312 and the n type MOSFET 312b composing the first gate circuit 312.

The diode forward voltage drop Vf of the npn transistors 321 through 325 composing the temperature sensor 32 is delivered from the E terminal 43 as an output signal of the temperature sensor 32 upon ON operation of the first gate circuit 312. The E terminal 43 is connected through a resistor 51 disposed outside the semiconductor device for sensing physical quantity 3 to an external terminal 52 at a power supply potential. An A/D converter 53 is connected between the E terminal 43 and the GND terminal 41. A current I flows through the temperature sensor 32 calculated by the equation: the current I=(power supply voltage−the voltage at the E terminal 43)/a resistance value of the resistor 51. The A/D converter 53 measures the voltage between the E terminal 43 and the GND terminal 41, which is an output signal of the temperature sensor 32 delivered from the E terminal 43 to the outside of the semiconductor device for sensing physical quantity 3.

One end of the pull-down resistor 314 is connected to drains of the p type MOSFET 313a composing the second gate circuit 313 and n type MOSFET 313b composing the second gate circuit 313. In other words, the one terminal is connected to the E terminal 43 through the second gate circuit 313. The other terminal of the pull-down resistor 314 is connected to the ground. The pull-down resistor 314 pulls a voltage applied to the second gate circuit 313 down to the ground potential when the second gate circuit 313 is in an OFF state to deliver the Low signal for the EPROM 34 forcedly to the second gate circuit 313. As a consequence, even though the second gate circuit 313 is subjected to a noise, the second gate circuit 313 is prevented from malfunctioning thereby maintaining the OFF state of the second gate circuit 313.

The shift resistor 33 converts a serial digital data given from the outside to a parallel digital data synchronously with an external clock supplied to the CLK terminal, which is not depicted in FIG. 2 but corresponds to the fourth terminal 24 in FIG. 1. The shift resistor 33 also converts the trimming data composed of the parallel digital data stored in the EPROM 34 to a serial digital data. The shift resistor 33 further stores a control data supplied from a DS terminal, which is not depicted in FIG. 2 but corresponds to the third terminal 23 in FIG. 1, a data to be delivered to the EPROM 34, a trimming data to be delivered to an adjusting circuit, which is not depicted in FIG. 2 but corresponds to the adjusting circuit 14 in FIG. 1, and a data supplied from the EPROM 34. The EPROM 34 stores a trimming data composed of a parallel digital data supplied from the shift resistor 33.

The sharing circuit of a terminal pad 31, the temperature sensor 32, the shift resistor 33, and the EPROM 34 function as the sharing circuit 17, the temperature detecting circuit 18, the auxiliary memory circuit 12, and the main memory circuit 13 indicated in FIG. 1, respectively. The GND terminal 41, the Vcc terminal 42, and the E terminal 43 correspond to the first terminal 21, the second terminal 22, and the fifth terminal 25, respectively. Though not depicted in FIG. 2, the semiconductor device for sensing physical quantity 3 comprises, like the semiconductor device for sensing physical quantity 1 shown in FIG. 1, the components corresponding to the operation selecting circuit 11, the adjusting circuit 14, the Wheatstone bridge circuit 15, the amplifier circuit 16, and the third, fourth, sixth, seventh and eighth terminals 23, 24, 26, 27, and 28.

Figure 3:
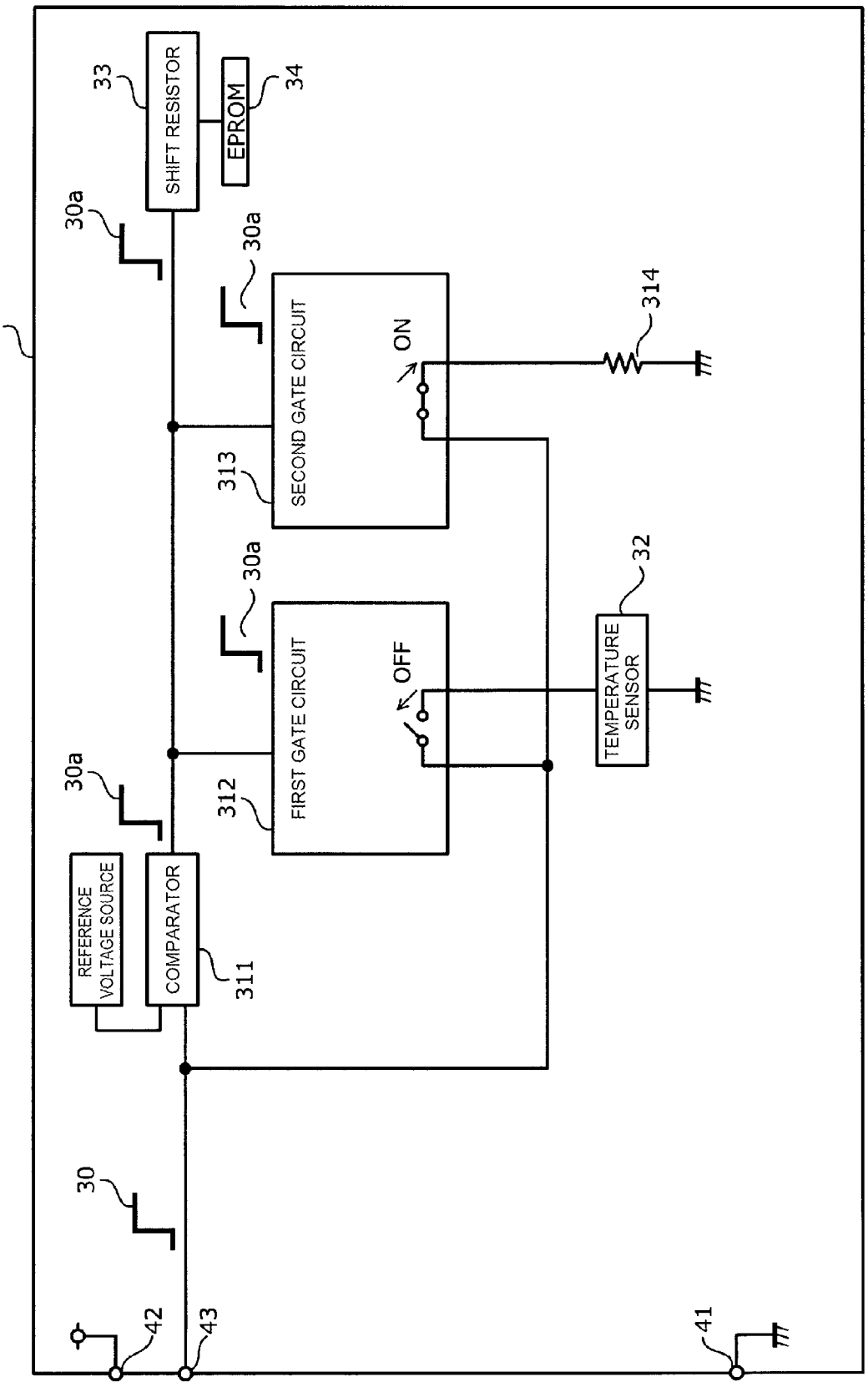
FIG. 3 is a circuit diagram showing a state upon writing a High signal in operation of a semiconductor device for sensing physical quantity according to an embodiment of the present invention.
Figure 4:
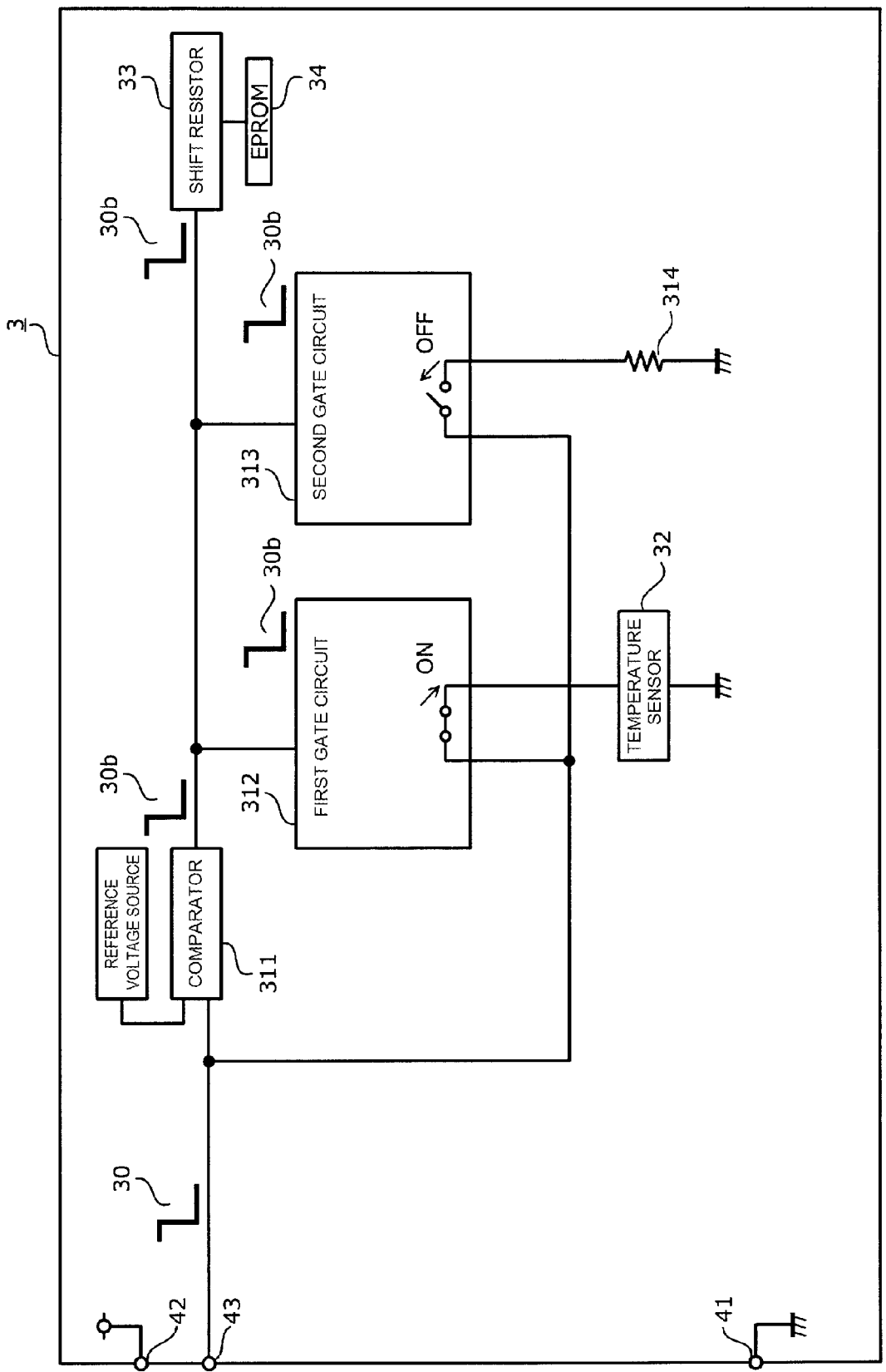
FIG. 4 is a circuit diagram showing a state upon writing a Low signal in operation of a semiconductor device for sensing physical quantity according to an embodiment of the present invention.
Figure 5:
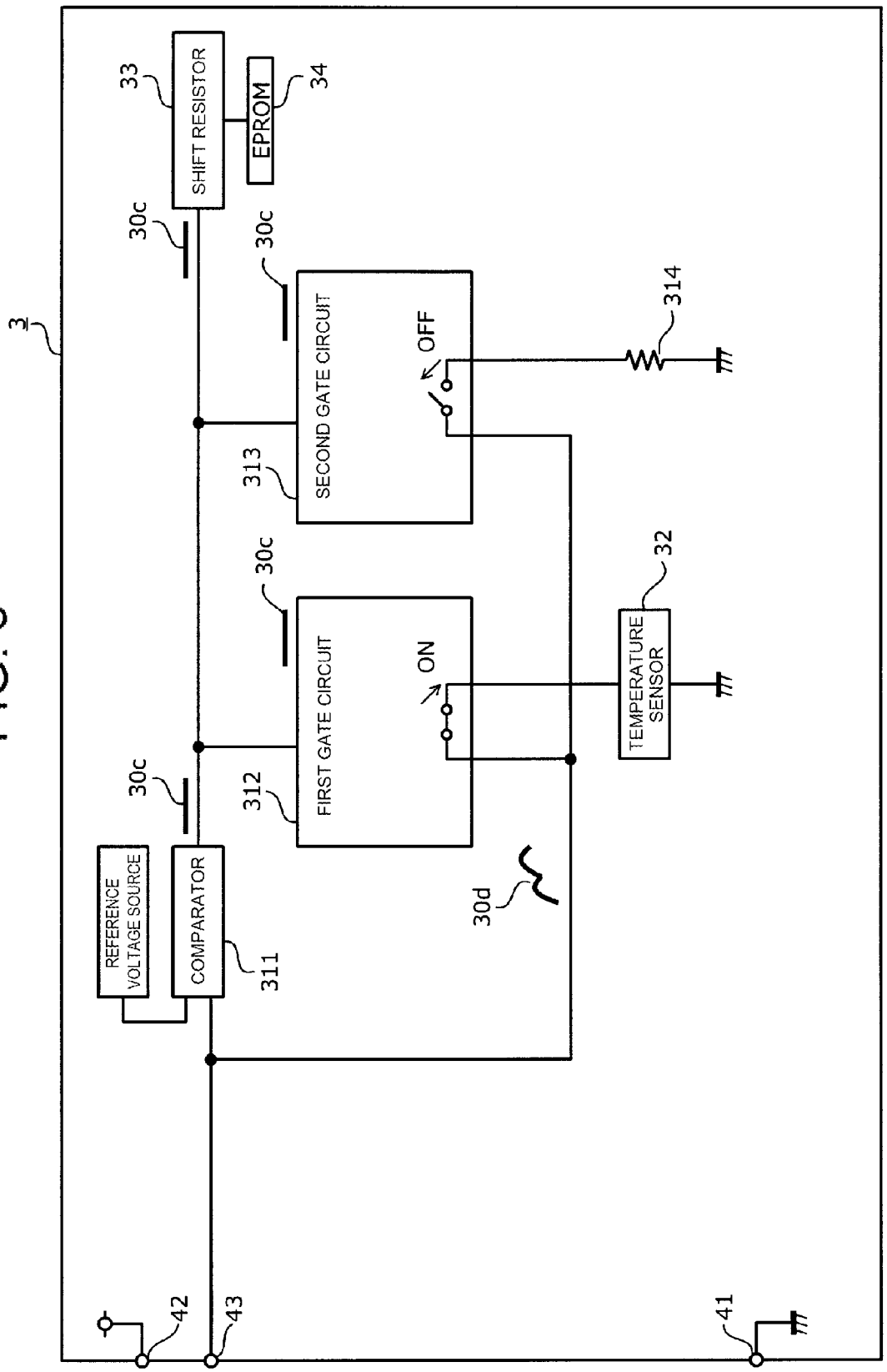
FIG. 5 is a circuit diagram showing a state when an output signal of a temperature sensor is delivered externally.
Figure 6:
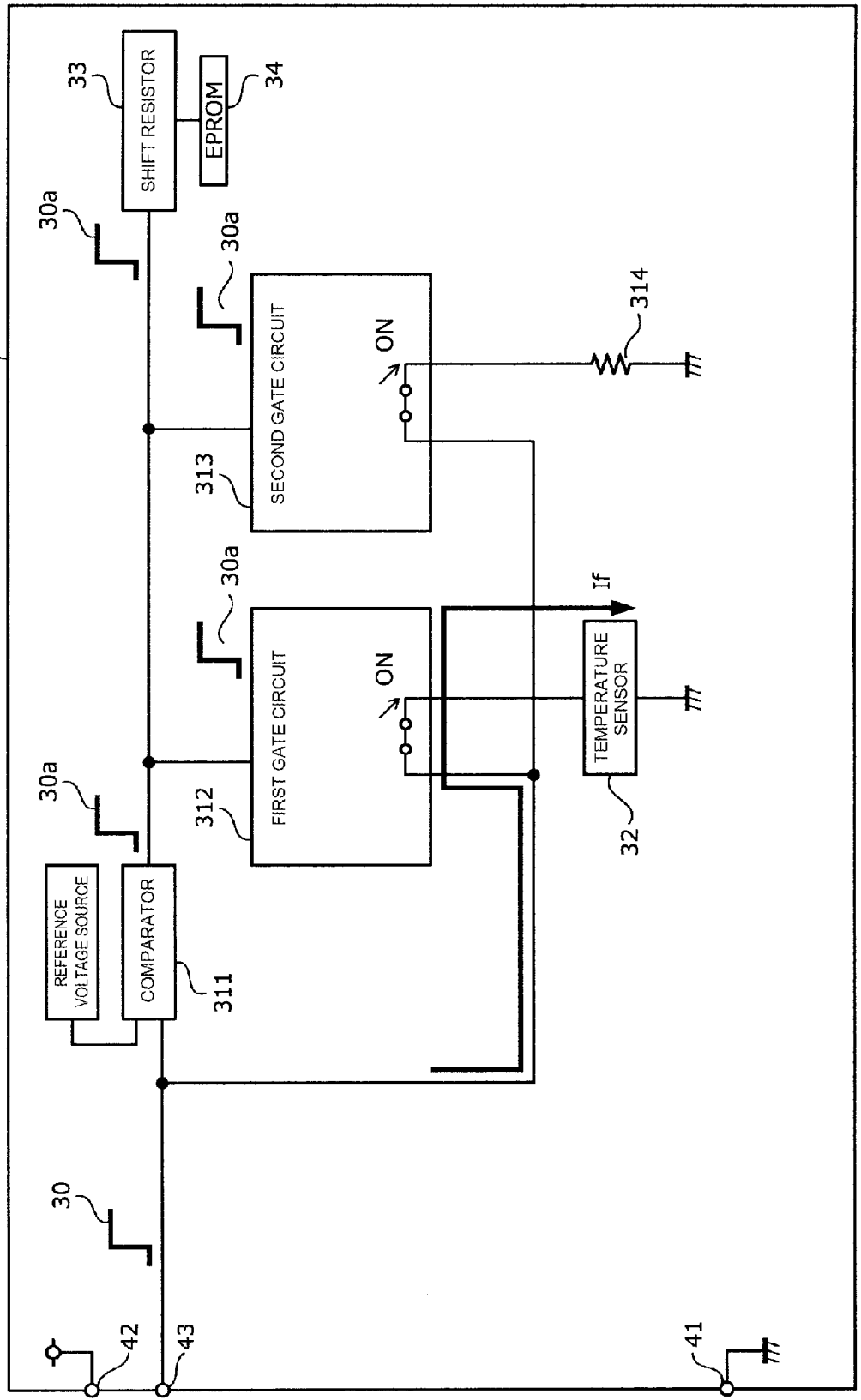
FIG. 6 is a circuit diagram showing a state upon writing a High signal in operation of a semiconductor device for sensing physical quantity of a comparative example.

Now, operation of the semiconductor device for sensing physical quantity 3 having the above-described construction will be described in the following. FIG. 3 and FIG. 4 are circuit diagrams showing the states in operation of a semiconductor device for sensing physical quantity 3 according to an embodiment of the present invention. FIG. 5 is a circuit diagram showing a state when an output signal of a temperature sensor is delivered externally in a semiconductor device for sensing physical quantity 3 according to an embodiment of the present invention. The FIGS. 3 and 4 show an operation state for writing the trimming data to the EPROM 34, for example, during adjustment stage before operation of a completed product of a semiconductor device for sensing physical quantity 3. More specifically, FIG. 3 shows the case the write control signal for the EPROM 34 is the High signal, and FIG. 4 shows the case the write control signal for the EPROM 34 is the Low signal. FIG. 5 shows an operation state of a semiconductor device for sensing physical quantity 3 as a practical product. FIG. 6 is a circuit diagram showing an operation state of a comparative example of a semiconductor device for sensing physical quantity.

Description is first made about an operation in the case the write control signal for the EPROM 34 is the High signal in an operation mode of writing into the EPROM 34. As shown in FIG. 3, an enable signal 30 is given through the E terminal 43 to the comparator 311, in which the input voltage Vin applied to the E terminal 43 is compared with the reference voltage Vref. If the input voltage Vin applied to the E terminal 43 is not lower than the reference voltage Vref: Vin≥Vref, the output signal of the comparator 311 becomes the High signal 30*a* for the EPROM 34. The High signal 30*a* for the EPROM 34 renders the first gate circuit 312 to disconnect the E terminal 43 and the temperature sensor 32, which is an OFF operation of the first gate circuit 312. The High signal 30*a* for the EPROM 34 renders the second gate circuit 313 to disconnect the E terminal 43 and the pull-down resistor 314, which is an ON operation of the second gate circuit 313.

Upon delivering the High signal 30*a* for EPROM 34 to the shift resistor 33, a trimming data is stored in the EPROM 34. If the E terminal 43 and the temperature sensor 32 are not disconnected by the first gate circuit 312 at this time, large diode forward current If flows through the npn transistors 321 through 325 composing the temperature sensor 32 due to the input voltage Vin applied to the E terminal 43 like the comparative example of the semiconductor device for sensing physical quantity 103 shown in FIG. 6. As a result, the temperature sensor 32 undergoes heating and the npn transistors 321 through 325 composing the temperature sensor 32 may be broken. The large diode forward current If flows through the temperature sensor 32 because the temperature sensor 32 is always in operation irrespective of the value of the write control signal in the writing operation to the EPROM 34.

In contrast in a semiconductor device for sensing physical quantity of the invention, the E terminal 43 and the temperature sensor 32 are disconnected when the write control signal for the EPROM 34 is the High signal 30*a*, preventing the temperature sensor 32 from breakdown. When the write control signal for the EPROM 34 is the High signal 30*a*, the second gate circuit 313 connects the E terminal 43 and the pull-down resistor 314. As a consequence, the output of the temperature sensor 32 is prevented from being delivered from the E terminal 43 to the outside. The trimming data to be written into the EPROM 34 is supplied from the DS terminal, for example.

In an operation mode for writing operation into the EPROM 34, when the input voltage Vin given to the E terminal 43 is lower than the reference voltage Vref: Vin<Vref, as shown in FIG. 4, the output signal of the comparator 311 becomes the Low signal 30*b* for the EPROM 34. According to the Low signal 30*b* for the EPROM 34, the first gate circuit 312 connects the E terminal 43 and the temperature sensor 32, which is an ON operation of the first gate circuit 312, and at the same time, the second gate circuit 313 disconnects the E terminal 43 and the pull-down resistor 314, which is an OFF operation of the second gate circuit 313. In this OFF operation of the second gate circuit 313, the voltage applied to the second gate circuit 313 is pulled down to the ground level by the pull-down resistor 314. Consequently, the second gate circuit 313 is forcedly provided with the Low signal of EPROM 30*b* for the EPROM 34. Therefore, unstable operation of the semiconductor device for sensing physical quantity 3 is avoided.

Upon delivering the Low signal 30*b* for the EPROM 34 to the shift resistor 33, the semiconductor device for sensing physical quantity 3 becomes in a steady state of trimming using the data stored in the EPROM 34. Because the ON operation of the first gate circuit 312 has connected the E terminal 43 and the temperature sensor 32 at this time, the output signal, which is a detected signal of the temperature sensor 32, can be delivered externally from the E terminal 43. Although a certain magnitude of current flows through the temperature sensor 32 since the temperature sensor 32 is connected to the E terminal 43, the input voltage Vin applied to the E terminal 43 is sufficiently low when the output signal of the comparator 311 is the Low signal 30*b* for the EPROM 34. Therefore, the temperature sensor 32 is not subjected to heavy current flow and is not broken.

Consequently, in operation of the semiconductor device for sensing physical quantity 3 as a practical product, the design can be mode, as shown in FIG. 5, so that an operation voltage of the temperature sensor 32, which is the input voltage Vin applied to the E terminal 43, is lower than the reference voltage Vref applied to the comparator 311: Vin<Vref. As a result, when the output signal of the temperature sensor 32 is delivered outside, the output signal of the comparator 311 is always Low signal 30*c* for the EPROM 34. As a consequence in the operation of the semiconductor device for sensing physical quantity 3 as a practical product, an output signal 30*d* of the temperature sensor 32 can be delivered to the outside. At the same time, a steady state can be established in which trimming is conducted for the output characteristic of a pressure sensor, for example, which is not depicted in FIG. 5 but corresponds to the Wheatstone bridge circuit 15 in FIG. 1, using the data stored in the EPROM 34.

Thus, when the output signal 30*d* of the temperature sensor 32 is delivered to the outside, the E terminal 43 is used only for an output terminal to draw out the output signal 30*d* of the temperature sensor 32 to the outside, ensuring normal operation of the temperature sensor 32. To measure the output signal 30*d* of the temperature sensor 32, as described earlier referring to FIG. 2, a resistor 51 is disposed between the external terminal 52 at a power supply potential and the E terminal 43 of the semiconductor device for sensing physical quantity 3 and a voltage between the end at the E terminal 43 side of the resistor 51 and the GND terminal 41 is detected by an A/D converter 53, as shown in FIG. 2. In an operation mode for writing the trimming data into the EPROM 34, since the circuit construction does not allow the output signal 30*d* of the temperature sensor 32 to be delivered outside, the E terminal 43 is only used as an input terminal for receiving an enable signal from the outside.

The operation mode for the EPROM 34 is only an example and a plurality of operation modes can be added based on other control flags. Examples of other control flags include: a control data from the DS terminal, an input signal to the CLK terminal, and a voltage applied to the CG terminal corresponding to the sixth terminal 26 indicated in FIG. 1 and a voltage applied to the EV terminal corresponding to the seventh terminal 27 indicated in FIG. 1. In the operation mode in which the write control signal for the EPROM 34 is the High signal 30*a*, additional operation modes are possible including: as well as writing a trimming data into the EPROM 34, delivering serial digital data from the shift resistor 33 to the outside, conducting trimming using the data stored in the shift resistor 33, transferring the data stored in the shift resistor 33 to the EPROM 34, and transferring the data stored in the EPROM 34 to the shift resistor 33. In the operation mode in which the write control signal for the EPROM 34 is the High signal 30*a*, an operation mode can be added to input a serial digital data from the outside into the shift resistor 33, as well as the operation mode to conduct trimming using the data stored in the EPROM 34.

The embodiment example of the present invention as described above is provided with the sharing circuit of a terminal pad between the terminal pad, which is the E terminal, and the EPROM and between the terminal pad and the temperature sensor. When the output signal of the temperature sensor is delivered externally, the first gate circuit is changed-over into an ON state so that the existing terminal pad is connected to the temperature sensor and the terminal pad can be used for an output terminal of the temperature sensor. Thus, an additional function can be newly provided without adding a new terminal. For a temperature sensor for vehicles, an occupied area of a sharing circuit of a terminal pad can be made smaller than that of a terminal pad, reducing the chip area and a cost. Even if the occupied area of a sharing circuit of a terminal pad is larger than that of a terminal pad, the number of terminals does not need to be increased and can be maintained at the same number, allowing use of existing manufacturing facilities and testing equipment. This is advantageous in manufacturing cost and favorable for the case in which the number of terminals cannot be increased.

In the embodiment example, the operation voltage of the temperature sensor 32 given to the terminal pad which is the E terminal 43 is lower than the reference voltage Vref that has a magnitude between the High signal for the EPROM at a power supply potential level and the Low signal for the EPROM at the ground level. Consequently, the write control signal for the EPROM is always the Low signal when the output signal of the temperature sensor is delivered externally. Therefore, the output signal of the temperature sensor can be extracted without any malfunctioning. The terminal pad, which receives an enable signal in the process of writing a trimming data to the EPROM, is used only in the process of trimming after completion of the product, and is not used in the essential functions of the actual product in operation of a semiconductor device for sensing physical quantity. Thus, the use of the terminal pad for delivering the output signal of the temperature sensor is effective utilization of an existing terminal Therefore, a semiconductor device for sensing physical quantity having an additional function is obtained at a low cost and a small number of terminals without impairing reliability of other functions.

A semiconductor device for sensing physical quantity of the invention can be applied to sensor devices for a variety of physical quantities including: humility, velocity, acceleration, light, magnetic quantity, and sound. Although the embodiment example described above uses the E terminal for the output terminal of the temperature sensor, another existing terminal can also be used for the output terminal of the temperature sensor. In that case, a sharing circuit of a terminal pad is provided between the terminal sharing with the output terminal for the temperature sensor and the shift resistor, and between the sharing terminal and the temperature sensor. The terminal shared with the output terminal for the temperature sensor is preferably selected from such terminals that input or output relatively long period signal or a relatively large amplitude signal, for example the DS terminal. Although the embodiment example has an additional function of temperature sensing, a semiconductor device for sensing physical quantity of the present invention can have any additional functions of physical quantity sensors other than the principal sensor.

As described thus far, a semiconductor device for sensing physical quantity is useful for semiconductor devices for sensing physical quantity such as a pressure sensor and an acceleration sensor used for vehicles, medical equipment, and industrial devices. The semiconductor device for sensing physical quantity of the invention is particularly advantageous for such semiconductor devices for sensing physical quantity that perform sensitivity adjustment, temperature characteristic adjustment, or offset adjustment by means of electrical trimming using an EPROM.

DESCRIPTION OF SYMBOLS 1, 3: semiconductor device for sensing a physical quantity
11: operation selecting circuit
12: auxiliary memory circuit:
13: main memory circuit
14: adjusting circuit
15: Wheatstone bridge circuit
16: amplifier circuit
17: sharing circuit
18: temperature detecting circuit
21: first terminal
22: second terminal
23: third terminal
24: fourth terminal
25: fifth terminal
26: sixth terminal
27: seventh terminal
28: eighth terminal
30: enable signal
30a: High signal for EPROM:
30b, 30c: Low signal for EPROM
30d: output signal of the temperature sensor
31: sharing circuit of a terminal pad
32: temperature sensor
33: shift resistor
34: EPROM
41: GND terminal
42: Vcc terminal
43: E terminal
51: resistor
52: external terminal
53: A/D converter
311: comparator
312: first gate circuit
312a: p type MOSFET composing the first gate circuit
312b: n type MOSFET composing the first gate circuit
312c: inverter composing the first gate circuit
313: second gate circuit
313a: p type MOSFET composing the second gate circuit
313b: n type MOSFET composing the second gate circuit
313c: inverter composing the second gate circuit
314: pull-down resistor
321-325: npn transistor composing a temperature sensor
Vref: reference voltage

What is claimed is:

1. A semiconductor device for sensing a physical quantity, the semiconductor device including a first sensor element generating an electric signal corresponding to a detected value of the physical quantity and a nonvolatile main memory circuit storing a trimming data for adjusting an output characteristic of the first sensor element during a writing operation, and for adjusting the output characteristic of the first sensor element based on the trimming data, wherein the semiconductor device further includes:

an input terminal that receives an input signal at a specified voltage;
a second sensor element that generates an electric signal corresponding to a detected temperature;
a comparator circuit that compares the specified voltage applied to the input terminal and a predetermined reference voltage, and that delivers a control signal for controlling writing operations into the main memory circuit based on the comparison result;
a first switch; and
a first changeover circuit that changes-over ON and OFF of the first switch for selectively connecting the input terminal and the second sensor element according to the control signal;
wherein the input terminal also serves as an output terminal to deliver externally an electric signal generated by the second sensor element when the first changeover circuit changes the first switch to an ON state and connects the input terminal and the second sensor element.

2. The semiconductor device for sensing physical quantity according to claim 1, wherein the comparator circuit, when the specified voltage is lower than the reference voltage, delivers the control signal that is a first specific signal to prohibit writing into the main memory circuit, and the first changeover circuit changes-over the first switch into an ON state according to the first specific signal.

3. The semiconductor device for sensing physical quantity according to claim 2, further comprising:
   a second switch;
   a resistor that is connected to the second switch at one end of the resistor and the other end is grounded; and
   a second changeover circuit that changes-over ON and OFF of the second switch to connect the input terminal and the resistor according to the control signal;
   wherein the second changeover circuit changes-over the second switch into an OFF state according to the first specific signal to disconnect the input terminal and the resistor, thereby pulling down a voltage applied on the second changeover circuit to the ground level.

4. The semiconductor device for sensing physical quantity according to claim 2, wherein:
   the comparator circuit, when the specified voltage is not lower than the reference voltage, delivers the control signal that is a second specific signal to permit writing into the main memory circuit;
   the first changeover circuit changes the first switch into an OFF state according to the second specific signal to disconnect the input terminal and the second sensor element; and
   the trimming data is written into the main memory circuit according to the second specific signal.

5. The semiconductor device for sensing physical quantity according to claim 4, further comprising:
   a second switch;
   a resistor that is connected to the second switch at one end of the resistor and the other end is grounded; and
   a second changeover circuit that changes-over ON and OFF of the second switch to connect the input terminal and the resistor according to the control signal;
   wherein the second changeover circuit changes-over the second switch into an ON state according to the second specific signal to connect the input terminal and the resistor.

6. The semiconductor device for sensing physical quantity according to claim 1, wherein:
   the comparator circuit, when the specified voltage is not lower than the reference voltage, delivers the control signal to permit writing into the main memory circuit;
   the first changeover circuit changes the first switch into an OFF state according to the control signal to disconnect the input terminal and the second sensor element; and
   the trimming data is written into the main memory circuit according to the control signal.

7. The semiconductor device for sensing physical quantity according to claim 6, further comprising:
   a second switch;
   a resistor that is connected to the second switch at one end of the resistor and the other end is grounded; and
   a second changeover circuit that changes-over ON and OFF of the second switch to connect the input terminal and the resistor according to the control signal;
   wherein the second changeover circuit changes-over the second switch into an ON state according to the second specific signal to connect the input terminal and the resistor.

8. The semiconductor device for sensing physical quantity according to claim 1, wherein an operation voltage of the second sensor element is lower than the reference voltage.

9. The semiconductor device for sensing physical quantity according to claim 2, wherein an operation voltage of the second sensor element is lower than the reference voltage.

10. The semiconductor device for sensing physical quantity according to claim 3, wherein an operation voltage of the second sensor element is lower than the reference voltage.

11. The semiconductor device for sensing physical quantity according to claim 4, wherein an operation voltage of the second sensor element is lower than the reference voltage.

12. The semiconductor device for sensing physical quantity according to claim 5, wherein an operation voltage of the second sensor element is lower than the reference voltage.

\* \* \* \* \*